United States Patent
Zhang et al.

(10) Patent No.: US 12,222,784 B2
(45) Date of Patent: Feb. 11, 2025

(54) ELECTRONIC APPARATUS

(71) Applicant: Lenovo (Beijing) Limited, Beijing (CN)

(72) Inventors: Guowen Zhang, Beijing (CN); Tianshui Tan, Beijing (CN); Yizhi Shi, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 228 days.

(21) Appl. No.: 18/179,141

(22) Filed: Mar. 6, 2023

(65) Prior Publication Data
US 2023/0297148 A1 Sep. 21, 2023

(30) Foreign Application Priority Data
Mar. 21, 2022 (CN) .......................... 202210280867.1

(51) Int. Cl.
*G06F 1/20* (2006.01)
*G06F 1/16* (2006.01)
*H05K 7/20* (2006.01)

(52) U.S. Cl.
CPC .......... *G06F 1/206* (2013.01); *H05K 7/20145* (2013.01); *H05K 7/20209* (2013.01)

(58) Field of Classification Search
CPC ...... G06F 1/1652; G06F 1/1637; G06F 1/206; G06F 1/1677; G06F 21/554; G06F 1/1675; G06F 2200/201; G06F 1/16; G06F 1/20; H04M 1/0268; H04M 1/0237; H05K 7/20145; H05K 7/2039; H05K 7/20454; H05K 7/2049; H05K 7/20209; H05K 7/20154; H05K 7/20263; F28F 2255/04; F28F 2255/02
See application file for complete search history.

(56) References Cited

U.S. PATENT DOCUMENTS

| | | | |
|---|---|---|---|
| 2006/0176243 A1* | 8/2006 | Yeh ....................... | G06F 1/1624 345/30 |
| 2013/0058063 A1* | 3/2013 | O'Brien ................ | G06F 1/1624 361/807 |
| 2013/0201208 A1* | 8/2013 | Cho ...................... | G06F 3/0488 345/619 |

(Continued)

OTHER PUBLICATIONS

Electronic Equipment; DU et al. CN108540604 (Year: 2018).*

(Continued)

*Primary Examiner* — Michael A Matey
(74) *Attorney, Agent, or Firm* — ANOVA LAW GROUP, PLLC

(57) ABSTRACT

An electronic apparatus includes a retractable module, a flexible module, and a control module. The retractable module includes a first retractable structure and a second retractable structure that are connected to each other. The flexible module includes a vibration film and a one-way valve connected to the vibration film. The vibration film includes a first state and a second state. The control module is configured to control the vibration film to enter the second state from the first state in response to the first retractable structure being away from the second retractable structure and perform heat dissipation on the electronic apparatus through the vibration film and the one-way valve in the second state.

10 Claims, 2 Drawing Sheets

(56) References Cited

U.S. PATENT DOCUMENTS

| | | | |
|---|---|---|---|
| 2016/0021785 A1* | 1/2016 | Zhang | H05K 7/20145 |
| | | | 361/689 |
| 2016/0033846 A1* | 2/2016 | Van Lieshout | G02F 1/16753 |
| | | | 359/290 |
| 2017/0031387 A1* | 2/2017 | Kim | G06F 1/1652 |
| 2017/0280570 A1* | 9/2017 | Li | H04M 1/0268 |
| 2021/0089086 A1* | 3/2021 | Zhong | G06F 1/1652 |

OTHER PUBLICATIONS

A Mobile Communication Terminal Screen Can Be Rolled Up; Zou, Gen-biao; CN109587299 (Year: 2019).*
Flexible Display Device; Zhang, Zhi-chao; CN111508364 (Year: 2020).*
Display Device And Display Device; Tian et al. CN113450647 (Year: 2021).*
Electronic Device; Chen, Wei, CN113810529 (Year: 2021).*
Flexible Display Device; Wu et al.; CN205264275 (Year: 2016).*

* cited by examiner

ELECTRONIC APPARATUS

CROSS-REFERENCE TO RELATED APPLICATION

This application claims priority to Chinese Patent Application No. 202210280867.1, filed on Mar. 21, 2022, the entire content of which is incorporated herein by reference.

TECHNICAL FIELD

The present disclosure relates to the terminal technology field and, more particularly, to an electronic apparatus.

BACKGROUND

A rollable electronic apparatus is often bulky because the apparatus needs to accommodate a flexible screen and a contraction structure. Such an electronic apparatus is not thin and light. To make the electronic apparatus thin and light, a passive heat dissipation solution is adopted to dissipate the heat of the electronic apparatus in the existing technology. However, during the operation of the electronic apparatus, a processor is used with reduced frequency when heat dissipation is insufficient. Thus, the system performance of the electronic apparatus is low, which affects user experience.

SUMMARY

Embodiments of the present disclosure provide an electronic apparatus, including a retractable module, a flexible module, and a control module. The retractable module includes a first retractable structure and a second retractable structure that are connected to each other. The flexible module includes a vibration film and a one-way valve connected to the vibration film. The vibration film includes a first state and a second state. The control module is configured to control the vibration film to enter the second state from the first state in response to the first retractable structure being away from the second retractable structure and perform heat dissipation on the electronic apparatus through the vibration film and the one-way valve in the second state.

In the electronic apparatus of embodiments of the present disclosure, by causing the first retractable structure to be away from the second retractable structure, the vibration film of a flexible module enters the second state from the first state. The vibration film occupies remained space after the first retractable structure extends outside of the electronic apparatus. Heat dissipation can be performed on the electronic apparatus through a heat dissipation air flow generated by the vibration film. Thus, the flexible module of the electronic apparatus of embodiments of the present disclosure does not need to occupy additional space of the electronic apparatus, the heat dissipation performance of the electronic apparatus can be effectively improved. Therefore, an effective heat dissipation solution can be provided for the electronic apparatus, and the performance and user experience can be improved.

DETAILED DESCRIPTION OF THE EMBODIMENTS

Figure 1:
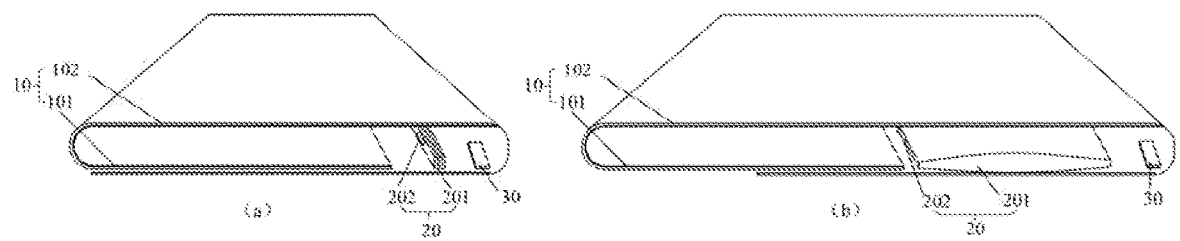
FIG. 1 illustrates a schematic structural diagram of an electronic apparatus according to some embodiments of the present disclosure.

To describe the purpose, technical solutions, and advantages of embodiments of the present disclosure, embodiments of the present disclosure are described in detail below with reference to the accompanying drawings. The following description of embodiments is intended to illustrate and explain a general concept of embodiments of the present disclosure and should not be considered to limit embodiments of the present disclosure. In the specification and drawings, same or similar reference numerals refer to same or similar parts or components. The drawings are not necessarily drawn to scale, and some well-known components and structures can be omitted from the drawings for clarity.

In some embodiments, unless otherwise specified, technical or scientific terms used herein shall have the ordinary meaning as understood by those of ordinary skill in the art. "first," "second," and similar terms used in embodiments of the present disclosure do not represent any order, quantity, or importance, and are only used to distinguish one element from another. The word "a" or "an" does not exclude a plurality. The word "comprising" or "including" means that the element or item listed before the word covers the element or item listed after the word and its equivalents, and does not exclude other elements or items. The terms "connected" or "coupled" are not restricted to physical or mechanical connections, and can include electrical connections, whether direct or indirect. "upper," "lower," "left," "right," "top," or "bottom" is used merely to indicate a relative position relationship. The relative position relationship can change when an absolute position of the described object changes. When an element such as a layer, a film, a region, or a substrate is referred to as being "on" or "under" another element, the element can be "directly" "on" or "under" another element or an intermediate element can exist.

In the related technology, cooling can be performed on the electronic apparatus in two manners. In one manner, a fan, a heat pipe, or a heat sink can be added to the electronic apparatus, or heat-conductive paste and conductive material can be used to dissipate the heat of the electronic apparatus. However, these structures can occupy space of the electronic apparatus to increase an overall thickness of the electronic apparatus, which reduces the user experience. In the other manner, cooling of the electronic apparatus is not performed through the fan and heat pipe. The heat of the electronic apparatus can be dissipated through the conductive material, which can greatly reduce the heat dissipation performance of the electronic apparatus to cause the processor of the electronic apparatus to have a large frequency reduction or the electronic apparatus to use an ultra-low voltage processor, which affects the user experience.

Embodiments of the present disclosure provide an electronic apparatus. FIG. 1 illustrates a schematic structural diagram of an electronic apparatus according to some embodiments of the present disclosure. The electronic apparatus includes at least a retractable module 10, a flexible module 20, and a control module 30. The retractable module 10 includes at least a first retractable structure 101 and a second retractable structure 102 connected to each other. The flexible module 20 includes at least a vibration film 201 and a one-way valve 202 connected to the vibration film 201. The vibration film 201 includes at least a first state and a second state. The control module 30 can be configured to control the vibration film 201 to enter the second state from the first state when the first retractable structure 101 moves away from the second retractable structure 102. The heat dissipation can be performed on the electronic apparatus through the vibration film 201 and the one-way valve 202 in the second state.

As shown in FIG. 1(a), the first retractable structure 101 is located inside the electronic apparatus. The first retractable structure 101 and the second retractable structure 102 can be flexible structures. For example, the first retractable structure 101 and the second retractable structure 102 may be flexible screens. The vibration film 201 can be a flexible vibration film. Thus, the vibration film 201 can be folded to be in the first state as shown in FIG. 1(a), and the vibration film 301 can be expanded to be in the second state as shown in FIG. 1(b).

In some embodiments, when the first retractable structure 101 is located inside the electronic apparatus. That is, when the first retractable structure 101 is not away from the second retractable structure 102, the vibration film 201 can be in the first state as shown in FIG. 1(a). When the first retractable structure 101 is away from the second retractable structure 102, the vibration film 201 can enter the second state from the first state. The expanded vibration film 201 can be used to cool down the electronic apparatus through the heat dissipation airflow generated by vibration.

Only some structures of the electronic apparatus of embodiments of the present disclosure are shown in the drawings of embodiments of the present disclosure. Other structures included in the electronic apparatus are not shown. The structure of the electronic apparatus shown in the drawings of embodiments of the present disclosure is only a feasible and flexible structure of the electronic apparatus. The electronic apparatus of embodiments of the present disclosure is suitable for any one electronic apparatus with changing internal space.

In some embodiments, the control module 30 can be a unit of a processor in the electronic apparatus or can be a control module of the electronic apparatus configured to individually control the heat dissipation, which is not limited in embodiments of the present disclosure.

In the electronic apparatus of embodiments of the present disclosure, by causing the first retractable structure to be away from the second retractable structure, the vibration film of the flexible module can enter the second state from the first state and occupy the remaining space of the electronic apparatus after the first retractable structure extends out of the electronic apparatus. The heat dissipation can be performed on the electronic apparatus through the heat dissipation airflow generated by the vibration film. Thus, the flexible module of the electronic apparatus of embodiments of the present disclosure does not need to occupy the space of the electronic apparatus, and the heat dissipation performance of the electronic apparatus can be effectively improved. Therefore, an effective heat dissipation solution can be provided to cause the electronic apparatus to be thin and light, and the application performance and the user experience can be improved.

Figure 2:
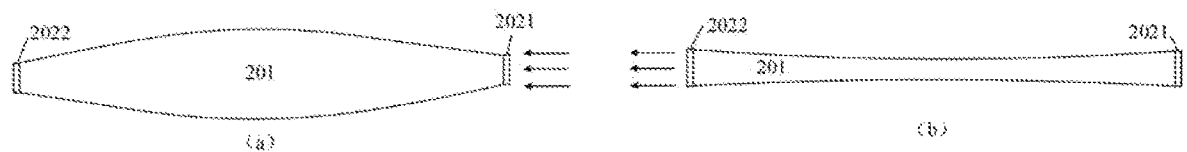
FIG. 2 illustrates a schematic structural diagram showing a vibration film in a second state according to some embodiments of the present disclosure.

In some embodiments, the vibration film 201 includes an air inlet and an air outlet. The one-way valve 202 includes an air inlet valve 2021 arranged at the air inlet and an air outlet valve 2022 arranged at the air outlet as shown in FIG. 2. FIG. 2 illustrates a schematic structural diagram showing a vibration film in a second state according to some embodiments of the present disclosure.

As shown in FIG. 2, the control module 30 is also configured to cyclically open the air inlet valve 2021 and the air outlet valve 2022 in sequence when the vibration film 201 is in the expanded second state. The control module 30 is further configured to control the vibration film 201 to vibrate to generate the heat dissipation airflow with a flow speed greater than a predetermined speed to perform the heat dissipation on the electronic apparatus. As shown in FIG. 2(a), the air inlet valve 2021 is opened, and the air enters the vibration film 201. When the air fills the inside of the vibration film 201, the air outlet valve 2022 can be opened. The air inlet valve 2021 and the air outlet valve 2022 can be opened cyclically in sequence. The heat dissipation airflow can be generated through the vibration of the flexible vibration film and can flow out of the air outlet valve 2022 to perform the heat dissipation on the electronic apparatus.

In some embodiments, the predetermined speed of the heat dissipation airflow cannot be fixed and constant. The predetermined speed can change according to an environment where the electronic apparatus is located. For example, if the environment where the electronic apparatus is located has a temperature higher than 20° C., the control module 30 can be configured to increase vibration frequency of the vibration film 201. Thus, the speed of the heat dissipation airflow can be increased, and the temperature inside the electronic apparatus can be cooled faster to improve the heat dissipation efficiency.

Figure 3:
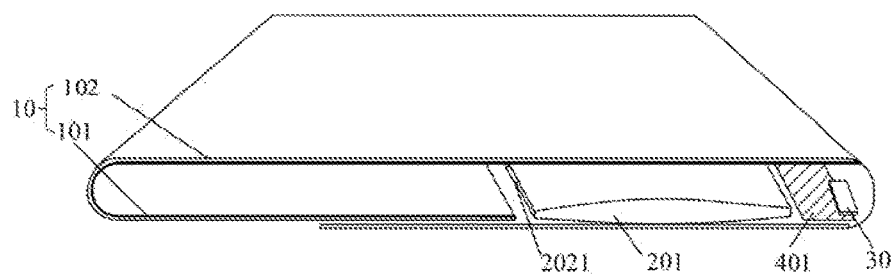
FIG. 3 illustrates a structural diagram of an electronic apparatus according to some embodiments of the present disclosure.

In embodiments of the present disclosure, as shown in FIG. 3, the electronic apparatus further includes a processor 401. FIG. 3 illustrates a structural diagram of an electronic apparatus according to some embodiments of the present disclosure. The processor 401 is located inside the electronic apparatus close to a position of the air outlet of the vibration film 201. That is, the processor 401 can be close to the position of the air outlet valve 2022 (not shown in FIG. 3). After the vibration film 201 enters the second state from the first state, the control module 30 can be further configured to control the heat dissipation airflow to perform the heat dissipation on the processor 401. Thus, the temperature of the processor 401 of the electronic apparatus can be lowered efficiently to improve an operation speed of the electronic apparatus.

Figure 4:
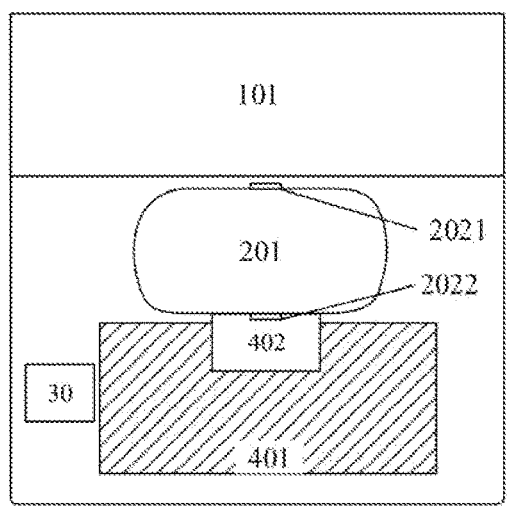
FIG. 4 illustrates a schematic structural diagram showing an inner side of an electronic apparatus according to some embodiments of the present disclosure.

In some embodiments, the electronic apparatus further includes a heat-conductive structure 402 as shown in FIG. 4. FIG. 4 illustrates a schematic structural diagram showing an inner side of electronic apparatus according to some embodiments of the present disclosure. The heat-conductive structure 402 can include a heat sink or a heat pipe. The heat sink can be connected to the air outlet and the processor 401. The heat sink can be configured to absorb the heat of the processor. The control module 30 can be further configured to control the heat dissipation airflow to take away heat of a heat-conductive structure, such as the heat sink, to indirectly dissipate the heat of the processor 401.

In some embodiments, a surface of the processor can be further covered with a heat-conductive paste or another heat-conductive material, for example, thermal silicone grease. The heat-conductive material and the heat-conductive structure can make the heat generated by the processor to be more effectively conducted to the heat-conductive material and heat-conductive structure. Then, the heat can be dissipated to the surrounding air through the heat-conductive material and the heat-conductive structure. The high-speed airflow generated by the vibration film can take away the heat in the air to cool the electronic apparatus.

Figure 5:
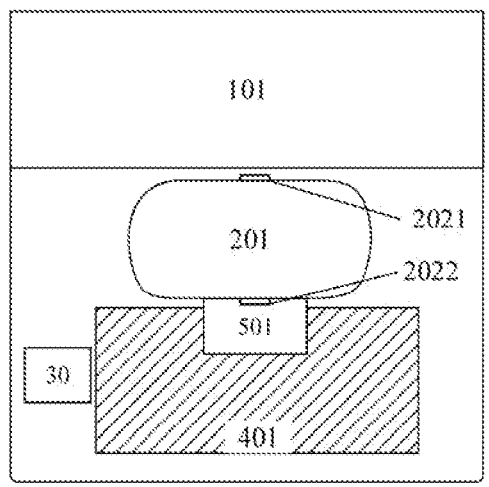
FIG. 5 illustrates a schematic structural diagram showing an inner side of an electronic apparatus according to some embodiments of the present disclosure.

In some embodiments, as shown in FIG. 5, the electronic apparatus can further include a phase change heat storage structure 501. FIG. 5 illustrates a schematic structural diagram showing an inner side of the electronic apparatus according to some embodiments of the present disclosure. The phase change heat storage structure 501 can be connected to the air outlet. That is, the phase change heat storage structure 501 can be close to the position of the air outlet valve 2022 of the vibration film 201. The temperature of the phase change heat storage structure 501 can be reduced through the heat dissipation airflow when the vibration film 201 is in the second state until the temperature of the phase change heat storage structure 501 is lower than a predetermined temperature.

In some embodiments, the phase-change heat storage structure 501 can be formed by a phase-change material. The predetermined temperature of the phase-change heat storage structure 501 can be a phase-change temperature of the phase-change heat storage structure 501. When the vibration film 201 is in the second state, the heat dissipation airflow generated by the vibration film 201 can take away the heat stored in the phase change heat storage structure 501. The temperature of the phase change heat storage structure 501 can be reduced until the temperature is reduced to the phase change temperature. A physical state of the material of the phase change heat storage structure 501 can change. That is, the material of the phase change heat storage structure 501 can have a phase change.

In some embodiments, the vibration film 201 can be in the first state. That is, the vibration film can be folded. When the heat dissipation of the electronic apparatus is no longer performed through the vibration film 201, the phase-change heat storage structure 501 can further absorb and store the heat generated inside the electronic apparatus to perform the heat dissipation on the electronic apparatus.

Figure 6:
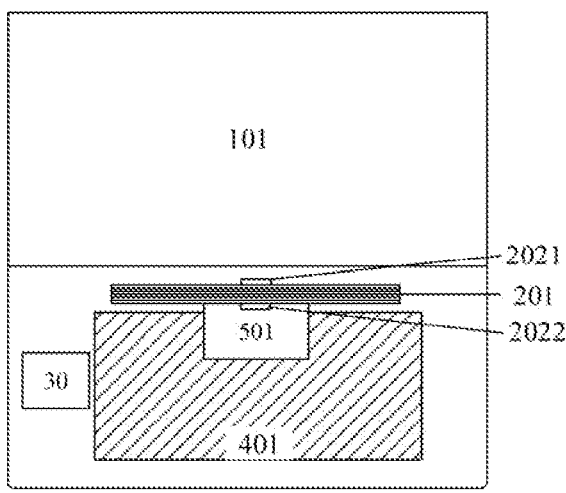
FIG. 6 illustrates a schematic structural diagram showing a vibration film in a first state according to some embodiments of the present disclosure.

In some embodiments, the vibration film 201 can be a flexible vibration film. The first state of the vibration film 201 can at least include a folded and retracted state. That is, as shown in FIG. 6, the vibration film is retracted into a folded fan shape. FIG. 6 illustrates a schematic structural diagram showing the vibration film in the first state according to some embodiments of the present disclosure.

In some embodiments, the first state of the vibration film 201 can further include a compressed state. That is, after the air in the vibration film 201 flows out, the air inlet valve of the vibration film 201 can be closed. Thus, the vibration film can be in the vacuum-compressed state.

In some embodiments, the vibration film 201 can also be a flexible vibration film with tension. After the air inlet valve 2021 of the vibration film 201 is opened, the air can enter the vibration film 201. Thus, the vibration film 201 can be expanded and inflated to a maximum state. When the air inlet valve 2021 and the air outlet valve 2022 are opened cyclically in sequence, the vibration film 201 can generate a cooling airflow through a change of the tension of the flexible vibration film. After the air inlet valve is closed, the tension of the vibration film 201 can disappear and be deflated to a minimum state.

In some embodiments, the second state of the vibration film 201 can include an expanded state.

When the first retractable structure is in the electronic apparatus, the vibration film of embodiments of the present disclosure can be compressed or folded in the minimum state, which occupies little internal space of the electronic apparatus. When the first retractable structure is away from the inside of the electronic apparatus, the vibration film can be expanded to cool the electronic apparatus. The heat dissipation performance of the electronic apparatus can be effectively improved, and the flexible heat dissipation structure of embodiments of the present disclosure does not occupy a large amount of the space of the electronic apparatus. Thus, an effective heat dissipation solution can be provided for the electronic apparatus to become thin and light.

In some embodiments, when the first retractable structure 101 is located inside the electronic apparatus, the control module 30 can be further configured to control the vibration film 201 to enter the expanded second state from the compressed first state when the first retractable structure 101 is away from the inside of the electronic apparatus and the second retractable structure 102. The expanded vibration film 201 can occupy a part of or all of the space inside the electronic apparatus. That is, when the vibration film is expanded to perform the heat dissipation on the electronic apparatus, whether the vibration film is completely expanded can be controlled according to the temperature of the electronic apparatus. For example, when the temperature of the electronic apparatus is detected to be lower than 10° C., the vibration film can be expanded non-completely and only occupy a part of the space inside the electronic apparatus to perform the heat dissipation. When the temperature of the electronic apparatus is detected to be higher than 10° C., the vibration film can be completely expanded and occupy the whole space in the electronic apparatus to quickly perform the heat dissipation.

In some embodiments, the vibration film 201 can also include a third state in which the vibration film 201 can be partially expanded. When the first retractable structure 101 is partially away from the inside of the electronic apparatus and the second retractable structure 102, the vibration film 201 can be controlled to enter the third state from the first state. The vibration film 201 in the third state can occupy a part of the space inside the electronic apparatus.

In some embodiments, when the electronic apparatus is used, the first retractable structure 101 can be partially extended out of the electronic apparatus, the vibration film 201 cannot be fully expanded in the space inside the electronic apparatus. Thus, when the vibration film 201 is partially expanded, the vibration film 201 can occupy a part of the space inside the electronic apparatus to cool the electronic apparatus.

In some embodiments, when the first retractable structure 101 returns back to the inside of the electronic apparatus, the control module 30 can be configured to control the vibration film to enter the first state from the second state or the third state, i.e. from the expanded or partially expanded state to the compressed or folded state. When the vibration film 201 is in the first state, the heat dissipation can be performed on the electronic apparatus through the heat-conductive structure and the phase change heat storage structure. Thus, after the vibration film is closed, the temperature of the electronic apparatus can still maintain the temperature to still be normal. The problem of reducing the frequency of the electronic apparatus due to the high temperature may not occur to affect the user experience.

Figure 7:
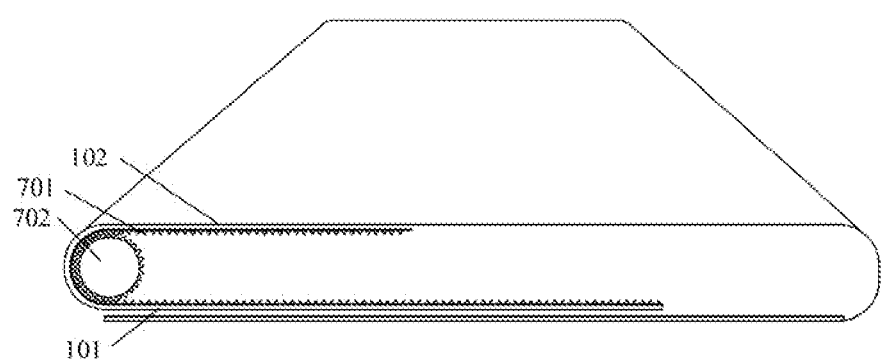
FIG. 7 illustrates a schematic structural diagram of an electronic apparatus according to some embodiments of the present disclosure.

In some embodiments, the first retractable structure 101 and the and second retractable structure 102 can be the flexible retractable structures, such as a flexible screen. As shown in FIG. 7, the electronic apparatus further includes a rollable device 70. FIG. 7 illustrates a schematic structural diagram of an electronic apparatus according to some embodiments of the present disclosure. The rollable device 70 includes at least a hinge 701 connected to a part of the first retractable structure 101 and a part of the second retractable structure 102, and a rotation shaft 702 coupled to the hinge 701. In embodiments of the present disclosure, the first retractable structure 101 can be controlled to move away from or close to the second retractable structure 102 through the hinge 701 and the rotation shaft 702.

In the electronic apparatus of embodiments of the present disclosure, by causing the first retractable structure to be away from the second retractable structure, the vibration film of the flexible module can enter the second state from the first state and occupy the remaining space of the electronic apparatus after the first retractable structure extends out of the electronic apparatus. The heat dissipation can be performed on the electronic apparatus through the heat dissipation airflow generated by the vibration film. Thus, the flexible module of the electronic apparatus of embodiments of the present disclosure does not need to occupy the space of the electronic apparatus. The internal space of the electronic apparatus can change obviously after the first retractable structure is retracted and expanded. After the first retractable structure is extended out, the expansion and the heat dissipation of the flexible module can be performed by using the space accommodating the first retractable structure inside the electronic apparatus, which greatly reduces the space needs of the heat dissipation module. Thus, the heat dissipation performance of the electronic apparatus can be effectively improved. Therefore, an effective heat dissipation solution can be provided to cause the electronic apparatus to be thin and light, and the performance and the user experience can be improved.

In embodiments of the present disclosure, the heat-conductive structure such as the heat pipe or heat sink can be mounted at the air outlet of the flexible vibration film. The heat-conductive structure can contact the processor to cool the processor. Thus, the processor can operate under the suitable temperature. Meanwhile, the phase change heat storage structure can be mounted at the air outlet. When the vibration film works, the temperature of the processor and the temperature of the phase change heat storage structure can be lowered to cause the temperature of the phase change heat storage structure to be lower than the phase change temperature. Thus, after being folded, the vibration film can perform the heat dissipation on the electronic apparatus.

The technical features of the technical solutions of embodiments of the present disclosure can be arbitrarily combined with each other when there is no conflict.

"One embodiment" or "an embodiment" described throughout the specification means that a particular feature, a structure, or a characteristic related to embodiments of the present disclosure can be included in at least one embodiment of the present disclosure. Thus, the phrases "in one embodiment" or "in an embodiment" in various places throughout the specification are not necessarily all referring to a same embodiment. In addition, the particular feature, the structure, or the characteristic can be combined in any suitable manner in one or more embodiments. In various embodiments of the present disclosure, the sequence numbers of the above-mentioned processes do not mean an execution sequence. The execution sequence of the processes should be determined by the function and inherent logic of the processes, and should not limit the implementation process of embodiments of the present disclosure. An order number of the processes of embodiments of the present disclosure are merely for description and do not represent the merits of the embodiments.

In the specification, the term "comprising," "including," or any other variation thereof are intended to cover a non-exclusive inclusion, so that a process, a method, or a device including a series of elements includes not only those elements but also other elements not explicitly listed or inherent to such process, method, or device. Without further limitation, an element defined by the phrase "comprising an . . . " does not exclude the presence of another same element in the process, method, article, or device that comprises the element. In some embodiments of the present disclosure, the disclosed apparatus and method can be implemented in other manners. The above-described device embodiments are merely illustrative, for example, the division of the unit is only a logical functional division, and the unit can be also divided in other manners. For example, a plurality of units or assemblies can be combined or integrated into another system, or some features can be omitted or may not be executed.

The above description is only some embodiments of the present disclosure. The scope of the present disclosure is not limited to this. Those skilled in the art can easily think of changes or substitutions within the technical scope of the present disclosure. These changes and substitutions shall be within the scope of the present disclosure. Therefore, the scope of the present invention shall be subject to the scope of the claims.

What is claimed is:

1. An electronic apparatus comprising:
   a retractable module including a first retractable structure and a second retractable structure that are connected to each other;
   a flexible module including a vibration film and a one-way valve connected to the vibration film, the vibration film including a first state and a second state; and
   a control module configured to control the vibration film to enter the second state from the first state in response to the first retractable structure being away from the second retractable structure and perform heat dissipation on the electronic apparatus through the vibration film and the one-way valve in the second state.

2. The electronic apparatus of claim 1, wherein:
   the vibration film includes an air inlet and an air outlet;
   the one-way valve includes an air inlet valve arranged at the air inlet and an air outlet valve arranged at the air outlet; and
   the control module is further configured to open the air inlet valve and the air outlet valve cyclically in sequence in the second state and control the vibration film to generate a heat dissipation airflow with a flow speed greater than a predetermined speed through vibration to perform the heat dissipation on the electronic apparatus.

3. The electronic apparatus of claim 2, further comprising:
   a processor arranged inside the electronic apparatus and close to a position of the air outlet of the vibration film;

wherein the control module is further configured to control the heat dissipation airflow to perform the heat dissipation on the processor.

4. The electronic apparatus of claim 3, further comprising:
a heat-conductive structure including a heat sink;
wherein:
the heat sink is connected to the air outlet and the processor and configured to absorb heat of the processor; and
the control module is further configured to control the heat dissipation airflow to perform heat dissipation on the heat-conductive structure.

5. The electronic apparatus of claim 2, further comprising a phase change heat storage structure, wherein:
the phase change heat storage structure is connected to the air outlet, and a temperature of the phase-change heat storage structure is reduced through the heat dissipation airflow when the vibration film is in the second state until the temperature of the phase-change heat storage structure is lower than a predetermined temperature; and
the phase-change heat storage structure is further configured to perform the heat dissipation on the electronic apparatus when the vibration film is in the first state.

6. The electronic apparatus of claim 1, wherein:
the vibration film includes a flexible vibration film;
the first state includes a folded or compressed state; and
the second state includes an expanded state.

7. The electronic apparatus of claim 1, wherein:
the first retractable structure is located inside the electronic apparatus;
the control module is further configured to control the vibration film to enter the second state from the first state in response to the first retractable structure being completely away from the inside of the electronic apparatus and the second retractable structure; and
the vibration film in the second state occupies a part of or an entire space inside the electronic apparatus.

8. The electronic apparatus of claim 7, wherein:
the vibration film further includes a third state, the vibration film being partially expanded in the third state;
the control module is further configured to control the vibration film to enter the third state from the first state in response to a part of the first retractable structure being away from the inside of the electronic apparatus and the second retractable structure; and
the vibration film in the third state occupies a part of the space inside the electronic apparatus.

9. The electronic apparatus of claim 8, wherein:
the control module is further configured to control the vibration film to enter the first state from the second state or the third state in response to the first retractable structure returning to the inside of the electronic apparatus; and
when the vibration film is in the first state, the heat dissipation is performed on the electronic apparatus through the heat-conductive structure and the phase change heat storage structure.

10. The electronic apparatus of claim 1, wherein the first retractable structure is a flexible retractable structure; the electronic apparatus further comprising a rollable device including:
a hinge connected to a part of the first retractable structure and a part of the second retractable structure; and
a rotation shaft coupled with the hinge, the hinge and the rotation shaft controlling the flexible retractable structure to be away from or close to the second retractable structure.

* * * * *